(12) United States Patent
Wu et al.

(10) Patent No.: US 7,189,481 B2
(45) Date of Patent: Mar. 13, 2007

(54) CHARACTERIZING FLARE OF A PROJECTION LENS

(75) Inventors: Bo Wu, San Jose, CA (US); Abdurrahman Sezginer, Los Gatos, CA (US); Franz X. Zach, Santa Clara, CA (US)

(73) Assignee: Invarium, Inc., San Jose, CA (US)

( * ) Notice: Subject to any disclaimer, the term of this patent is extended or adjusted under 35 U.S.C. 154(b) by 367 days.

(21) Appl. No.: 10/933,090

(22) Filed: Sep. 1, 2004

(65) Prior Publication Data

US 2006/0046167 A1    Mar. 2, 2006

(51) Int. Cl.
*G03F 9/00*    (2006.01)

(52) U.S. Cl. .......................... 430/30; 382/145; 382/149

(58) Field of Classification Search ................ 430/30; 382/145, 149
See application file for complete search history.

(56) References Cited

U.S. PATENT DOCUMENTS

| | | | | |
|---|---|---|---|---|
| 6,835,507 B2* | 12/2004 | Ki et al. | .......................... | 430/5 |
| 6,986,973 B2* | 1/2006 | Yao et al. | ....................... | 430/5 |
| 2004/0196447 A1* | 10/2004 | Watanabe | ...................... | 355/77 |
| 2005/0095510 A1* | 5/2005 | Yamamoto et al. | ............. | 430/5 |

OTHER PUBLICATIONS

Kirk, Joseph P., "Scattered Light in Photolithographic Lenses," SPIE vol. 2197, pp. 566-572.
Brunner, Timothy A. ; Carlos Fonseca; Nakgeuon Seong; Martin Burkhardt, "Impact of Resist Blur on MEF, OPC, and CD Control," Optical Microlithography XVII; Proc. SPIE vol. 5377, (May 2004) pp. 141-149.
Zach, Franz X; Chieh-Yu Lin; Joseph P. Kirk, "Aberration Analysis Using Reconstructed Aerial Images of Isolated Contacts on Attenuated Phase-Shift Masks," Optical Microlithography XIV, Proc. SPIE vol. 4346, (Sep. 2001) pp. 1362-1368.
Flagello, Donis G. ; Socha, Robert; Shi, Zuelong; van Schoot, Jan; Baselmans, Jan, van Kerkhof, Mark; de Boeiji, Wim; Engelen, Andre; Carpaij, Rene; Noordman, Oscar; Moers, Marco; Mulder, Melchoir; Finders, Jo; van Greevenbroek, Henk; Schriever, Martin; Maul, Manfred; Haidner, Helmut; Goeppert, Markus; Wegmann, Ulrich; Graeupner, Paul, "Optimizing and Enhancing Optical Systems to Meet the Los $k_1$ Challenge," Optical Microlithography XVI, Proceedings of SPIE vol. 5040 (2003) pp. 139-150.
Kirkpatrick, S. ; C.D. Gelatt, Jr. ; M.P. Vecchi, "Optimization by Simulated Annealing," Science, vol. 220, No. 4598, (May 13, 1983) pp. 671-680.
Chan et al, High-Resolution Maskless Lithography, Journal of Microlithography, Microfabrication, and Microsystems 02 (04), (2003) pp. 331-339.
Dennis, J.E. et al, Nonlinear Least Squares, Methods for Unconstrained Optimization and Nonlinear Equations, SIAM 1996, pp. 218-233.

* cited by examiner

*Primary Examiner*—Christopher G. Young
(74) *Attorney, Agent, or Firm*—Smith-Hill and Bedell

(57) ABSTRACT

Flare of an imaging system is measured using resist by employing the imaging system to directly expose a first part of the resist at an image plane of the imaging system to a first dose of radiation and to indirectly expose a second part of the resist as a result of flare. The imaging system exposes the second part of the resist to a second dose of radiation. Flare of the imaging system is determined from a pattern that is formed in the second part of the resist.

44 Claims, 9 Drawing Sheets

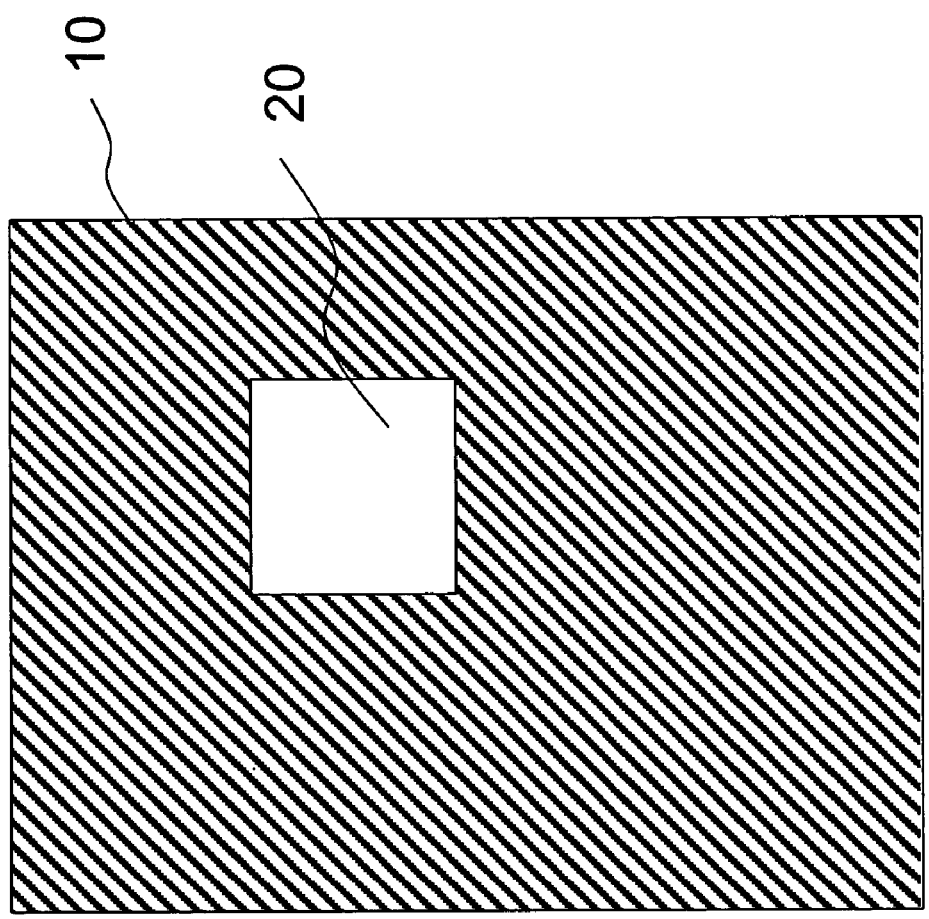

CHARACTERIZING FLARE OF A PROJECTION LENS

BACKGROUND OF THE INVENTION

This invention relates to a method of characterizing lithography projection equipment used in manufacturing of integrated circuits.

A conventional optical lithographic stepper system, for imagewise exposure of a coating of resist on a semiconductor wafer, includes a light source for emitting a beam of actinic radiation directed towards the wafer, an imaging lens for imaging the light source on an exposure mask (also called a reticle) that defines a pattern of features that are to be transferred from the mask to the resist coating, and a projection lens for imaging the mask on the resist coating. In many applications, the pattern defined by the exposure mask is binary. In this case, every point of the mask is either opaque or transparent and, subject to diffraction limitations, the lithographic system results in the resist coating being exposed in regions that correspond to transparent regions of the mask and being unexposed in regions that correspond to opaque regions of the mask. The resist is then developed, leaving a pattern of resist features that corresponds to the pattern of opaque features of the exposure mask (in the case of a positive resist), and the underlying wafer is selectively etched using the patterned resist to protect the wafer. FIG. 4 illustrates this ideal mode of operation. As shown in FIG. 4, resist features 4 are images of mask features 2. For simplicity, the projection lens between the mask and the wafer, and the image reduction effected by the projection lens are not shown in FIG. 4.

In operation, the optical lithographic stepper system effects stepwise relative movement of the exposure mask and wafer transverse to the axis of the system so that different fields of the wafer can be exposed through the mask. A field or "image field" is a region that is exposed without moving the wafer or the mask with respect to the lens; or in the case of a stepper-scanner instrument, a field is a region that is exposed in one, linear, continuous scanning motion of the wafer and mask stages. Stepper-scanners project a slit-shaped region, typically 26 mm by 8 mm, on the image plane (wafer). A field is exposed by scanning the slit-shaped image in a direction that is parallel to its short dimension. The maximum field size is on the order of 26 mm by 33 mm.

All imaging systems suffer from some amount of flare (an effect that mixes light from one part of the image with light from another part). Because flare represents imperfect behavior of an optical lithographic system, it is desirable to reduce the flare of the projection optics by good optics design and maintenance. However, some residual flare is inevitable even in the highest quality optics. This residual flare can be managed by taking flare into account in the design of the mask. The patterns on the mask can be compensated for flare and other optical imperfections. Compensating the mask for flare requires knowledge of the flare density function.

Flagello, D. et al., "Optimizing and Enhancing Optical Systems to Meet the Low $k_1$ Challenge", Proc. SPIE, vol. 5040, pp 139–150 (2003), discloses that scattered light in an optical lithography system may be measured using a reticle that is transparent except for opaque square pads of several different sizes. A photoresist detector is exposed through the reticle at several progressively increasing doses. The minimum exposure dose to clear each pad is determined.

Kirk, J. P., "Scattered Light in Photolithographic Lenses", Proc. SPIE Vol. 2197, p. 566–572 (1994), discloses that flare may be measured by observing the extent to which an edge of the photoresist has receded from the corresponding edge of the geometric image of an opaque feature.

Conventional approaches to measuring flare by exposing a photoresist detector assume a functional form of the flare density function. Density functions that have been used in the prior art include Gaussian functions, a sum of Gaussian functions, and Lorentzian functions (see T. Brunner et al., Impact of resist blur on MEF, OPC and CD control, Proc. SPIE Vol 5377, p. 141–149, SPIE, Bellingham, 2004). The functional form of the density function is obtained from the measurements through regression.

F. Zach et al. "Aberration Analysis using Reconstructed Aerial images of Isolated Contacts on Attenuated Phase shift masks" disclose a double exposure method for determining aberrations of a exposure tool. In this disclosure a uniform first exposure is superimposed onto a second exposure that images a contact hole. Based on an analysis of the image intensity in the sidelobe aberrations can be extracted.

U.S. patent application Ser. No. 10/860,853, the entire disclosure of which is hereby incorporated by reference herein for all purposes, discloses the following techniques for measuring flare: (1) Use a reticle that is transparent except for opaque circular pads of several different sizes and measure the exposure dose to clear each resist pad (for positive photoresist) or the exposure dose to cover each resist hole (for negative photo-resist). (2) Use a reticle that is opaque except for one or more pin-holes. Measure the corresponding receding edge of positive photoresist or the expanding edge of negative photo-resist for several different exposure doses. (3) Use a reticle with one or more lines and measure the critical dimension (CD) change due to flare caused by a second exposure. In the above methods, the flare density function is obtained either directly (Methods 1 and 2) or through regression (Method 3).

SUMMARY OF THE INVENTION

The object of the present invention is to characterize the flare of a projection lens.

In accordance with a first aspect of the invention there is provided a method of measuring flare of an imaging system having an image plane, said method comprising a. providing a resist detector that changes a property of interest when exposed to a dose of radiation equal or more than a critical dose D0, b. positioning the detector at the image plane of the imaging system, c. exposing the detector to a dose D1 of radiation utilizing a first spatial filter having a first bright feature and exposing the detector to a dose D2 of radiation utilizing a second spatial filter having a second bright feature, wherein D2 is less than D0, d. developing the resist detector, and e. determining a characteristic of a spatial pattern revealed by step d.

In accordance with a second aspect of the invention there is provided a method of measuring flare of an imaging system having an image plane, said method comprising a. providing a resist detector that includes a resist with critical dose D0, b. positioning the detector at the image plane of the imaging system, c. exposing the detector to a dose D1 of radiation utilizing a first spatial filter having a bright feature, exposing the detector to a dose D2 of radiation utilizing a second spatial filter having a bright feature, and exposing the detector to a dose D3 of radiation utilizing a third spatial filter having a bright feature, wherein the geometric images in the image plane of the bright features of the first and second spatial filters do not overlap the geometric image in the image plane of the bright feature of the third spatial filter, D2 and D3 are less than D0, and D1 is greater than D0, and d. determining whether said geometric image of the bright feature of the first or second spatial filter has received a dose that exceeds D0.

In accordance with a third aspect of the invention there is provided a method of measuring flare of an imaging system having an image plane, said method comprising a. providing a resist detector that includes a resist with critical dose D0, b. positioning the detector at the image plane of the imaging system, c. exposing the detector to a dose D1 of radiation utilizing a first spatial filter having a bright feature and exposing the detector to a dose D2 of radiation utilizing a second spatial filter having a bright feature, wherein the geometric images in the image plane of the bright features of the first and second spatial filters do not overlap, D2 is less than D0, and D1 is such that said geometric image of the bright feature of the second spatial filter has a first region for which the total dose is less than D0 and a second region for which the total dose is at least D0, and d. determining a characteristic of a boundary between the first and second regions.

In accordance with a fourth aspect of the invention there is provided a method of measuring flare of an imaging system, said method comprising a. providing resist at an image plane of the imaging system, b. employing the imaging system to directly expose a first part of the resist to a first dose of radiation and to indirectly expose a second part of the resist as a result of flare, c. employing the imaging system to expose the second part of the resist to a second dose of radiation, and d. determining the flare of the imaging system from a pattern that is formed in the second part of the resist.

Preferred embodiments of the present invention provide methods of measuring the flare density function of a projection lens using a test mask and a photoresist detector that comprises a positive photoresist film deposited on a wafer. On one exposure, one or more features of the test mask form flare measurement sites on the photoresist detector. On another exposure, one or more features of the test mask produce flare, which is a characteristic of the projection lens. In a first embodiment, flare can be characterized using methods that combine the above double exposure technique with another technique. In a second embodiment, the flare density function is obtained based on whether the photoresist is cleared at the flare measurement sites on the wafer. In a third embodiment, the flare density function is acquired from distance measurements performed on features printed on a multiply-exposed wafer.

BRIEF DESCRIPTION OF THE DRAWINGS

For a better understanding of the invention, and to show how the same may be carried into effect, reference will now be made, by way of example, to the accompanying drawings, in which:

FIG. 1A illustrates a mask test pattern consisting of a transparent feature that is used in both flare-producing exposures and flare-measuring exposures.

Figure 1B:
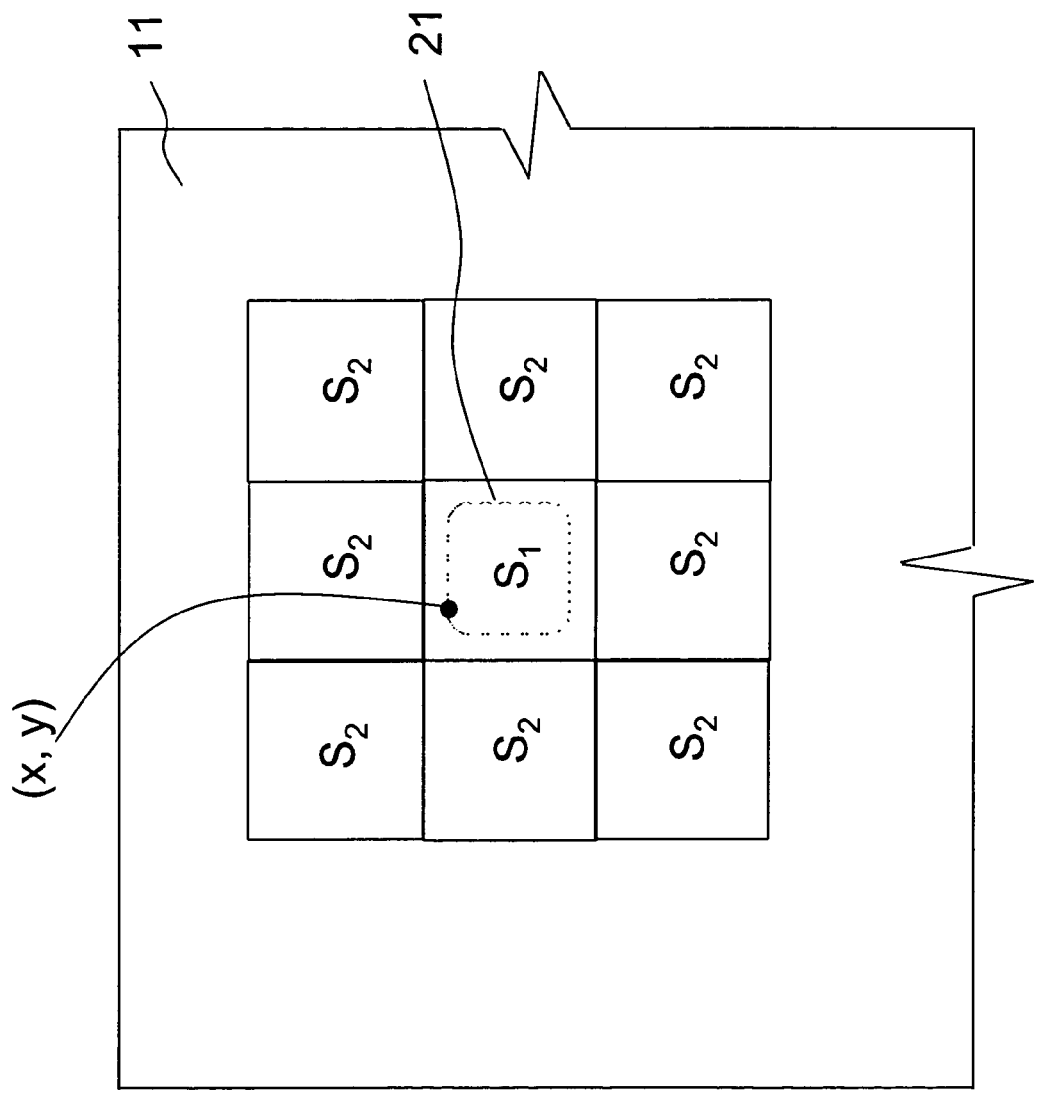
FIG. 1B illustrates imaging of the mask pattern in FIG. 1A on a resist detector in an optical lithographic system with flare.

Flare influence range is defined as the distance on the photoresist detector beyond which the flare density function of an imaging system is smaller than a pre-determined value, which is based on both uncertainties in the measurements and user's accuracy requirement. Meanwhile, the distance of flare variation is defined as the maximum distance on the photoresist detector below which any variation of the flare density function is smaller than said pre-determined value. In the above descriptions, the concept of flare density function is defined in U.S. patent application Ser. No. 10/860,853.

The photoresist detector is covered by a continuous film of photoresist before exposure. Critical dose D0 of the photoresist detector is defined such that the detector will change its property of interest if exposed to a dose that is equal or greater than D0 and will maintain the same property of interest if exposed to a dose that is smaller than D0. The property of interest may refer to any property the photoresist detector, such as chemical, physical, optical, geometrical property or the combination of any of the two or more properties. In a preferred embodiment, the critical dose refers to the dose-to-clear, which is defined for a positive photoresist as the minimum exposure dose at which there will be no photoresist on any part of the detector after exposure and development. In the above embodiment, the property of interest refers to the chemical property which results in the clearing of the photoresist after development. In a second embodiment, the critical dose means the dose-to-cover, which is defined for a negative photoresist as the minimum exposure dose at which the detector is still covered by a continuous film of photoresist after exposure and development. In a third embodiment, the critical dose Dt is defined such that the thickness of a positive photoresist after development is greater than a given value if the exposure dose is smaller than Dt and the thickness is smaller than the given value if the exposure dose is greater than Dt. The thickness of the photoresist can be either directly measured with an interferometer after development or indirectly measured with a development rate monitor during the development. Other methods of evaluating the above photoresist thickness are also acceptable.

"Pattern" means a spatial distribution within the photoresist detector, which in preferred embodiments is a geometrical property formed by the physical presence or absence of the photoresist after exposure and development and in other embodiments is a spatial distribution of any altered resist property of interest after exposure, such as a chemical property.

DETAILED DESCRIPTION

Flare Measurement using a Double Exposure Technique

Referring to FIG. 1A, a test structure that may be used to characterize flare by a double exposure method embodying the present invention comprises an opaque plate 10 with a transparent window 20. Window 20 is typically made by etching a thin film of chromium that is deposited on a fused silica plate.

Referring to FIG. 1B, there are two sets of fields $\{s_1\}$ and $\{s_2\}$ on a photoresist detector 11 that comprises a positive photoresist film deposited on a suitable substrate, such as a semiconductor wafer. Both sets of fields are exposed with window 20 as shown in FIG. 1A. As noted above, with current technology, the maximum field size for an optical lithography instrument is typically 26 mm×33 mm. When projected to the image plane, window 20 has a geometric image that is no larger than the maximum field size. The term "geometric image," as applied to a feature of the mask, means the image of the feature that would be produced in the image plane of the projection lens if the projection lens had no flare. It will be understood that although the same physical element may be used as a mask for more than one exposure, the manner in which the mask spatially filters the radiation emitted by the source towards the projection lens depends on the position of the mask in the object plane of the projection lens. Accordingly, depending on position, a given mask may form multiple spatial filters, each defining one or more bright features.

The fields of the first set $\{s_1\}$ form flare measurement sites on the photoresist detector. A field of the first set $\{s_1\}$ is exposed using the mask illustrated in FIG. 1A and a dose $D_p$ that is less than the dose-to-clear $D_0$ of the photoresist. This exposure is referred to as the primary or flare-measuring exposure of the field of the first set. Although FIG. 1B shows only one field of the set $\{s_1\}$, the set $\{s_1\}$ may comprise multiple fields and typically the fields of the set $\{s_1\}$ will be exposed with different doses.

The fields of the second set $\{s_2\}$ are exposed using the mask illustrated in FIG. 1A and a dose D that is preferably greater than the dose-to-clear $D_0$ of the photoresist. The exposure of the fields of the second set may be referred to as the secondary or flare-producing exposure. The flare produced by the secondary exposure illuminates the flare measurement sites of the first set $\{s_1\}$. The resist at the point (x,y) in a field of the first set clears upon developing the photoresist if the total exposure dose at (x,y) exceeds the dose-to-clear ($D_0$):

$$\text{if } D^*\text{flare}(x,y)+D_p>D_0, \text{ then resist clears} \tag{1}$$

At the edge 21 of the resist, the total exposure equals the dose to clear:

$$\text{flare}(x,y)=(D_0-D_p)/D \text{ at the resist edge} \tag{2}$$

The function flare(x,y) is the convolution of the flare density function with the flare producing (or bright) feature(s) of the mask used in the second exposure. The flare produced by the primary exposure of a field of the set $\{s_1\}$ is negligible compared to the flare produced by the secondary exposures of the fields of the second set $\{s_2\}$.

Equation (2) shows that the value of the function flare(x,y) is known at the edge of the developed resist. The location of the resist edge can be measured by microscopy. An optical microscope is preferred although a scanning electron microscope or an atomic force microscope may be used. Measuring the position of the resist edge for multiple values of the primary exposure dose $D_p$ enables mapping out the contour levels of the function f(x,y). The flare density function can be obtained from the contours of f(x,y) by regression.

Re-arranging Equation (2) as:

$$D=(D_0-D_p)/\text{flare}(x,y) \tag{3}$$

shows that the secondary exposure dose D that is needed to measure flare is significantly reduced as the primary exposure dose $D_p$ approaches the dose-to-clear $D_0$ from below. The double exposure method of the present invention reduces the exposure time required to measure flare compared to prior art, photoresist-based flare measurements.

Although FIG. 1B shows contiguous exposure fields, the exposure fields may be smaller than the step size between exposure fields in which case there would be gaps between the exposure fields. The doses for the fields of the set $\{s_2\}$ will normally be equal but they may be different.

Whether the resist at a particular elementary area of the detector changes its property of interest depends on the total dose received at that elementary area in both exposures. Accordingly, the order of the primary exposure and the secondary exposure can be changed. Thus, the fields of the second set $\{s_2\}$ may be exposed before the fields of the first set $\{s_1\}$.

Flare Measuring Vernier

A flare measuring vernier can be formed by providing multiple, closely spaced flare measurements sites, each exposed at a different dose $D_p$.

Figure 2A:
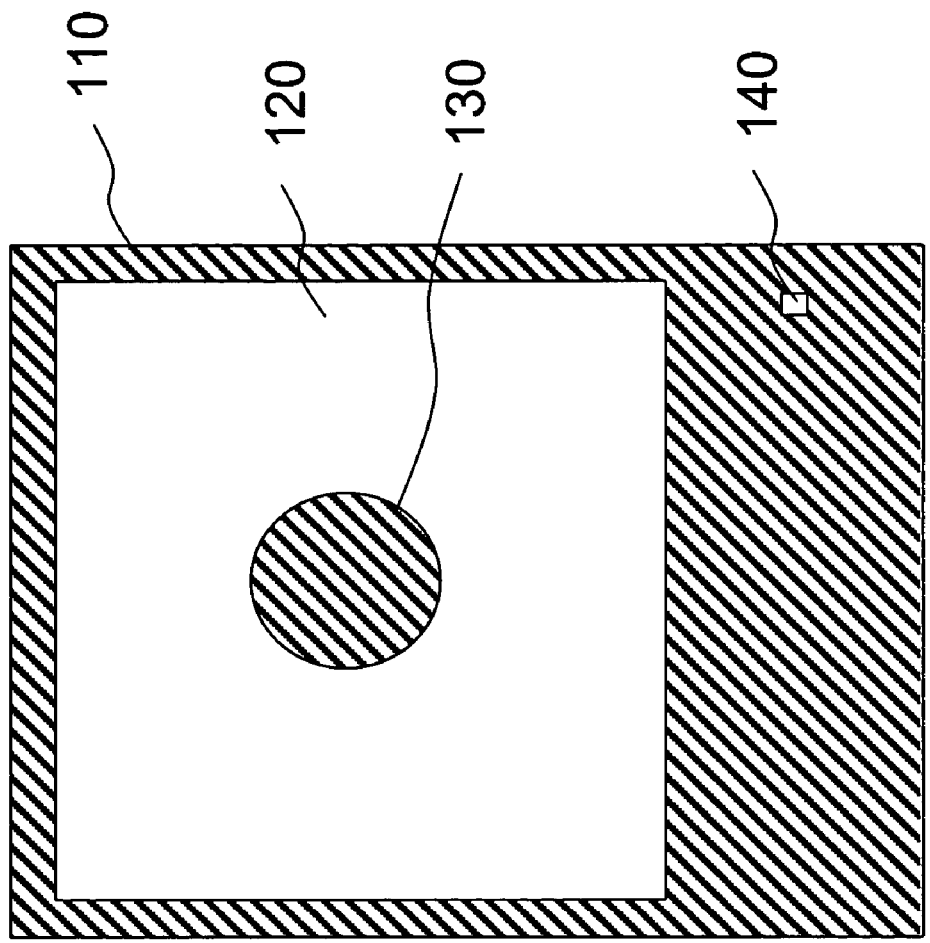
FIG. 2A illustrates a mask test pattern consisting of a transparent feature for flare-producing exposures and a transparent feature for flare-measuring exposures.

FIG. 2A illustrates a mask 110 in which a large transparent window 120 and an opaque circular pad 130 are defined. The size of window 120 is greater than the influence range of flare. The mask also defines a flare-measuring feature 140 which is much smaller than the distance of flare variation. The window 140 is preferably square-shaped, but other shapes are also possible.

Figure 2B:
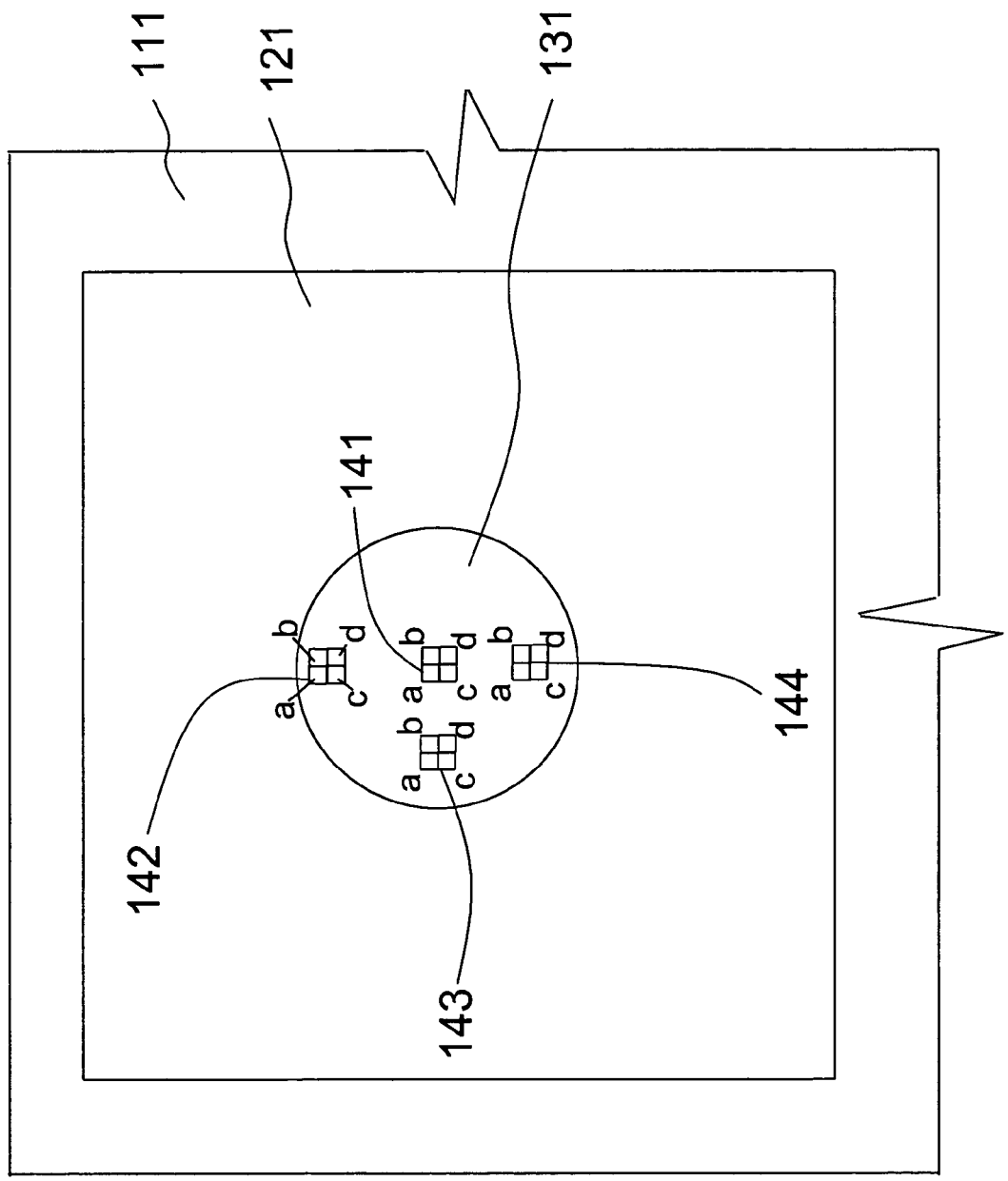
FIG. 2B illustrates imaging of the mask pattern in FIG. 2A on a resist detector in an optical lithographic system with flare.

FIG. 2B illustrates a resist pattern formed on a positive photoresist detector by multiple exposures using the mask that is shown in FIG. 2A. Flare measurement sites 141a, 141b, 141c, 141d, . . . in the photoresist are produced by feature 140 in FIG. 2A at primary exposure doses $D_{01}$, $D_{02}$, $D_{03}$, $D_{04}$, . . . respectively. These flare-measuring exposures are made by covering all features on mask 110, except the flare-measuring feature 140, by opaque blades. Site 141a is exposed at dose $D_{01}$, the wafer and mask stages are stepped over to expose site 141b. Site 141b is exposed at dose $D_{02}$, and so on. The flare-measuring doses are less than the dose-to-clear, $D_0$, and different from each other. For example:

$$D_{01}<D_{02}<D_{03}<D_{04}\ldots<D_0 \tag{4}$$

Circular resist pad 131 and clear region 121 are exposed by features 130 and 120 in FIG. 2A at dose D. This flare-producing dose is preferably much larger than the dose-to-clear, $D_0$. Feature 140 may be covered by opaque blades during the flare-producing exposure. The flare-producing exposure exposes flare measurement sites indirectly through flare.

The set of flare measurement sites 141a, 141b, 141c, 141d . . . form a flare measurement vernier, which is preferably located at the center of pad 131. The size of feature 140 is small enough that the size of said vernier is smaller than the distance of flare variation. Upon developing the resist, the resist at some of these sites in the vernier will clear, and some of them will not clear according to Equation (2). The smallest primary exposure dose at which the resist clears and the largest primary exposure dose at which the resist does not clear provide upper and lower bounds for the value of the flare at the center of pad 131. For example, if only features 141c and 141d clear, the flare F at the center of resist pad 131 is:

$$(D_0 - D_{03})/D < F < (D_0 - D_{02})/D.$$

Similarly, flare at other locations within the resist pad 131 can be obtained by providing flare-measuring verniers 142, 143, 144 inside pad 131. The flare density function can be solved by regression from the spatial variation of F in pad 131.

Figure 2C:
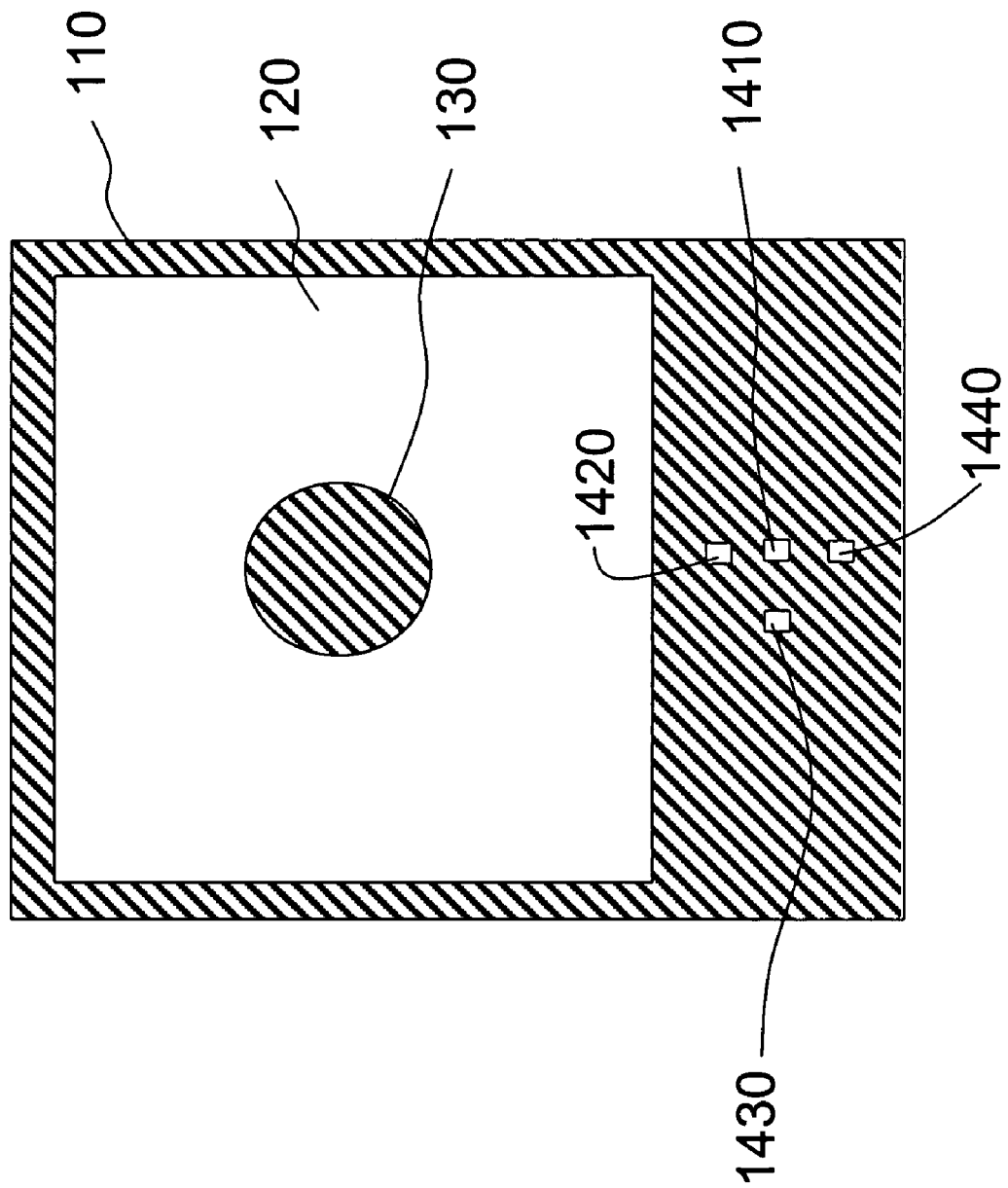
FIG. 2C illustrates a mask test pattern consisting of a transparent feature for flare-producing exposures and multiple transparent features for flare-measuring exposures.

FIG. 2C illustrates an alternative to the mask in FIG. 2A. Instead of one flare-measuring feature 140, the mask defines multiple flare-measuring features 1410, 1420, 1430 and 1440. Flare-measuring exposures are made by covering all features on mask 110, except features 1410, 1420, 1430 and 1440, by opaque blades. Sites 141a, 142a, 143a and 144a are exposed at dose $D_{01}$, the wafer and mask stages are stepped over to expose sites 141b, 142b, 143b and 144b, which are exposed at dose $D_{02}$, and so on. The size of each vernier 1410, 1420, 1430, 1440 is smaller than the distance of flare variation. The mask shown in FIG. 2C allows multiple flare measurement sites to be exposed in parallel, and thus is more efficient than the mask shown in FG. 2A.

Figure 3A:
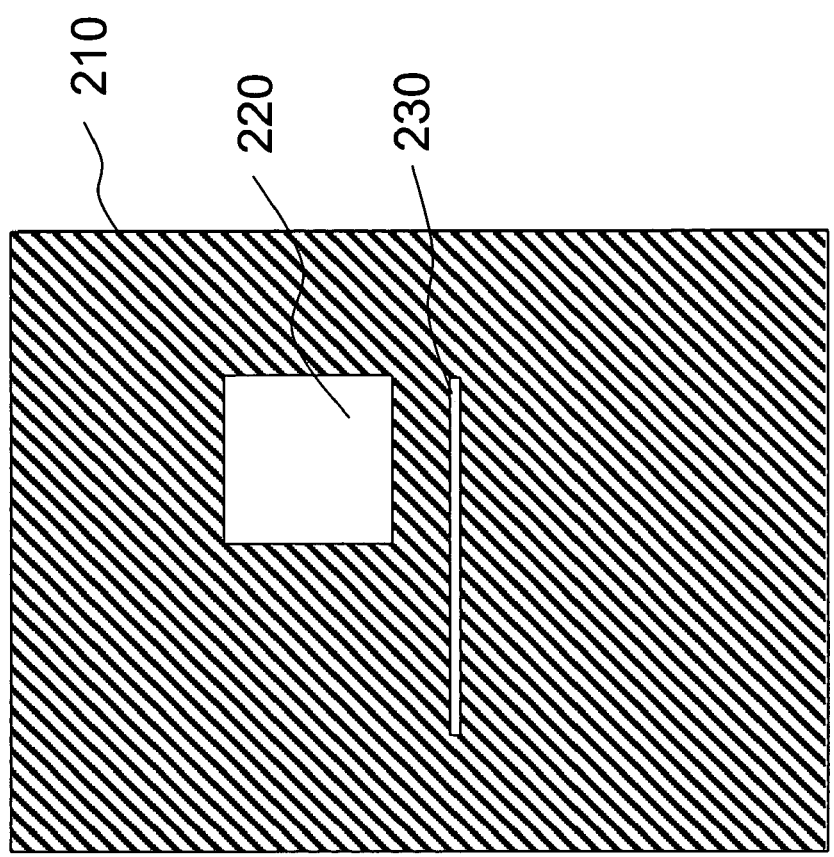
FIG. 3A illustrates a mask test pattern consisting of a transparent feature for flare-producing exposures and an elongated transparent feature for flare-measuring exposures.
Figure 3B:
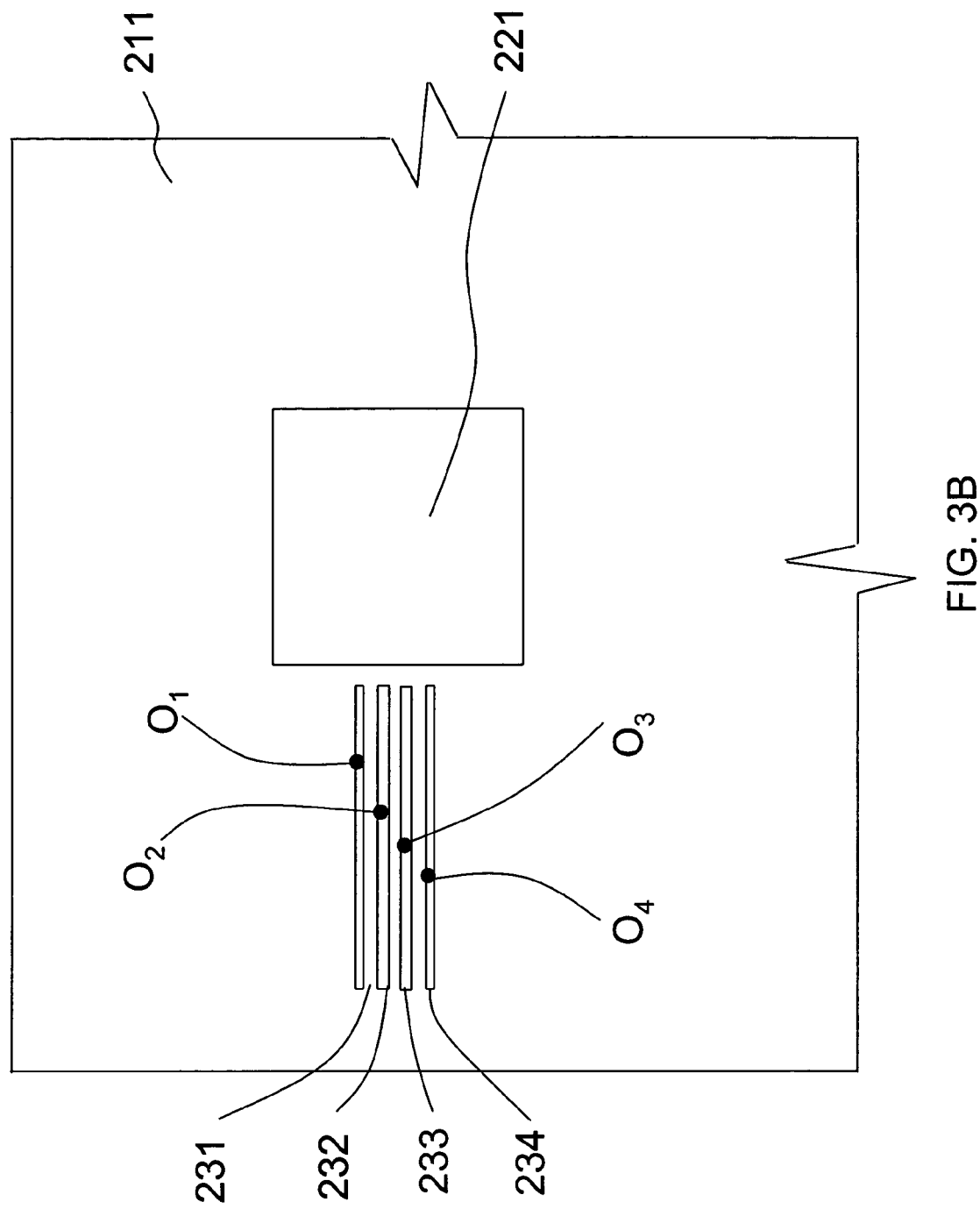
FIG. 3B illustrates imaging of the mask pattern in FIG. 3A on a resist detector in an optical lithographic system with flare.
Figure 3C:
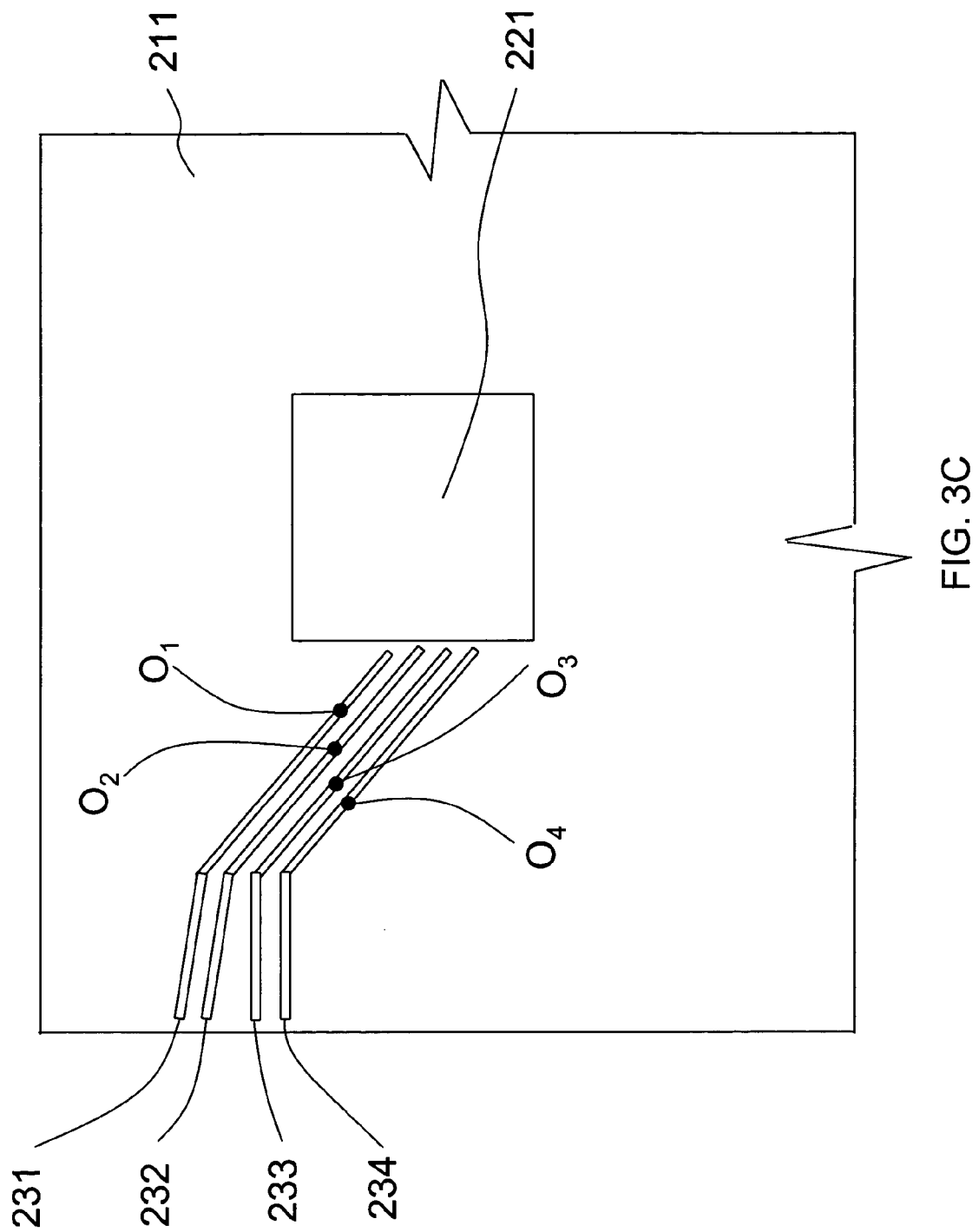
FIG. 3C illustrates imaging of a modification of the mask pattern shown in FIG. 3A on a resist detector, wherein the mask pattern includes an elongated transparent feature.
Figure 4:
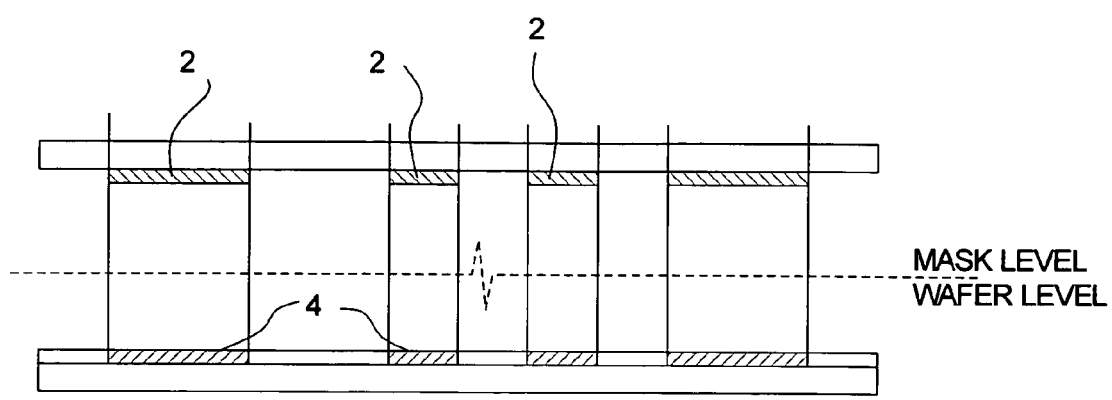
FIG. 4 illustrates imaging of mask features on a photoresist detector in an optical lithographic system without flare.

FIGS. 3A and 3B show another embodiment of the flare-measuring vernier. FIG. 3A illustrates a mask 210 in which a transparent window 220 and a transparent line 230 are defined. FIG. 3B illustrates the resist pattern produced on the wafer by multiple exposures through the mask shown in FIG. 3A. Flare-measuring lines 231, 232, 233, and 234 are produced by stepping and repeating the transparent line 230 in FIG. 3A at pre-exposure doses $D_{01}$, $D_{02}$, $D_{03}$, $D_{04}$, respectively. The length of the second transparent line 230 is comparable to the influence range of flare. The flare producing feature 220 is covered by opaque blades during the primary exposures. Alternatively, the flare-measuring and flare-producing features may be on separate masks. Open area 221 shown in FIG. 3B is produced by square window 220 in FIG. 3A at exposure dose D which is preferably much larger than the dose-to-clear. Suppose upon developing the resist, the resist edges are located at points $O_1$, $O_2$, $O_3$, and $O_4$ on lines 231, 232, 233, and 234, respectively. The values of flare at these four points are:

$$F_i = (D_0 - D_{0i})/D, i = 1, 2, 3, 4.$$

The location of points $O_1$, $O_2$, $O_3$, and $O_4$ can be measured by microscopy and the flare density function can be obtained by regression.

The flare measuring vernier can be used to measure long, medium and short-range flare. This technique is preferred for long and medium-range (wafer and field-scale) flare, because the disappearing resist pad method and the receding resist edge method require long exposure times when measuring medium and long-range flare.

In the different embodiments described above, the flare density function can be obtained by regression based on flare measurements. First of all, the flare density function is assumed to have a functional form $f(\alpha_i, x, y)$, where $\alpha_i (i=1, 2, \ldots n)$ are parameters and are determined by solving the following by a nonlinear least-square algorithm:

$$\text{FlareMeasurement}(x_m, y_m) = \iint f(\alpha_i, x_m, y_m, x', y') \cdot \text{mask}(x', y') \cdot dx' dy' \quad (5)$$

where mask(x',y') is a binary function describing the exposure pattern that is used to produce flare. As an example, in FIG. 3B, mask(x',y') equals one only in region 221 and is zero elsewhere. The index m labels the measurements, i.e. for point $O_3$, m=3.

Solution of equation (5) requires a nonlinear least-squares algorithm because $f(\alpha_i, x, y)$ is generally a nonlinear function of $\alpha_i$. Convex minimization algorithms such as Levenberg-Marquardt algorithm or Gauss-Newton algorithm (see J. E. Dennis Jr, R. B. Schnabel, *Numerical Methods for Unconstrained Optimization and Nonlinear Equations*, Soc. for Industrial & Applied Math., 1996) and are preferred for solving Equation (5). Genetic algorithms or simulated annealing may also be used (see Kirkpatrick, S., C. D. Gelatt Jr., M. P. Vecchi, "Optimization by Simulated Annealing," *Science*, 220, 4598, 671–680, 1983).

The dependence of $f(\alpha_i, x_m, y_m, x', y')$ on the field position (x',y'), which is implied but not explicitly shown on the right hand side of Equation (5), is obtained by repeating the test structure shown in FIG. 1B, 2B or 3B at different places in the field. The measurements of flare values and the calculation of Equation (5) are repeated at each field location. For example, the field locations can be spaced 2 mm apart along the long dimension of the slit of the stepper-scanner lens.

Flare degrades the performance of an optical lithography system and, in particular, may increase the variation in critical dimensions (CD) across the field and across the wafer. Consequently, the features of the mask are not accurately transferred to the wafer. The techniques described above for measuring flare can be used in optical proximity correction (OPC) to reduce variations in CD across the image field and thereby improve image fidelity.

Long-range flare causes variations in CD across the wafer. The long-range flare dose at each field can be calculated using the flare density function and the mask layout. It is then possible to calculate an adjusted dose for each field that will ameliorate the effect of long-range flare.

The invention has been described above in the context of optical lithography projection equipment in which the bright features of the mask are transparent to optical radiation and the dark features are opaque, and the image of the mask is projected by transmitting actinic radiation through the mask. However, the invention is also applicable to the case in which the bright features are reflective and the dark features are transparent or absorbing; and the image of the mask is projected by reflecting radiation from the mask. In this case, a reflective substrate is coated by an absorbing film, and the absorbing coating is selectively etched to produce bright features. This is practiced in extreme ultra-violet (EUV) lithography. Alternatively, the mask of FIG. 1A can be made by depositing a reflective coating on transparent plate 10 and removing the reflective coating in the complement of feature 20. The mask may be a spatial light modulator in a maskless-lithography instrument, which is typically a micro-machined array of mirrors [see: Chang et al., High-resolution maskless lithography, Journal of Microlithography, Microfabrication, and Microsystems 02(04), p. 331–339, 2003]. Hence "exposing the detector . . . utilizing a spatial filter having a bright feature" is to be understood as not being limited to transmission of actinic radiation through a mask but to include any interaction between the actinic radiation and the mask.

The techniques that have been described herein for measuring or characterizing flare are not limited to a particular lithography technique and are thus applicable to projection lithography in general.

The actinic radiation may be electromagnetic radiation, such as visible light, UV, EUV, or X-ray radiation, or a particle beam such as an electron beam. The nature of the resist depends on the nature of the actinic radiation, e.g. an electron-beam resist is used in the case of an electron beam imaging system.

Although the invention has been described with reference to a positive photoresist detector, in which the resist clears upon exposure to a clearing dose of actinic radiation, the invention is also applicable to a photoresist detector employing a negative resist, which covers any area exposed to a covering dose of active radiation.

It will be appreciated that the invention is not restricted to the particular embodiments that have been described, and that variations may be made therein without departing from the scope of the invention as defined in the appended claims and equivalents thereof. For example, although a square transparent feature 20 in FIG. 1A is used for both primary and secondary exposure, the technique is not restricted to the use of a single square window. One or more features of different sizes and shapes may be employed instead. As another example, although the elongated flare measurement sites in FIG. 3B are perpendicular to the adjacent boundary of feature 221, the measurement sites can have different angles with respect to feature 221 as long as the sites are long enough to cover the entire influence range of flare.

The invention claimed is:

1. A method of measuring flare of an imaging system having an image plane, said method comprising:
   a. providing a resist detector that changes a property of interest when exposed to a dose of radiation equal or more than a critical dose D0,
   b. positioning the detector at the image plane of the imaging system,
   c. exposing the detector to a dose D1 of radiation utilizing a first spatial filter having a first bright feature and exposing the detector to a dose D2 of radiation utilizing a second spatial filter having a second bright feature, wherein D2 is less than D0,
   d. developing the resist detector, and
   e. determining a characteristic of a spatial pattern revealed by step d.

2. A method according to claim 1, wherein in step a, the resist is a positive resist and D0 is the dose-to-clear.

3. A method according to claim 1, wherein in step a, the resist is a negative resist and D0 is the dose-to-cover.

4. A method according to claim 1, wherein D1 is greater than D0.

5. A method according to claim 1, wherein the respective first and second bright features of the first and second spatial filters define respective first and second geometric images in the image plane, which geometric images do not overlap.

6. A method according to claim 1, wherein the first spatial filter defines a dark feature surrounded by the first bright feature and the geometric image of the second bright feature is located within the boundary defined by the geometric image of said dark feature.

7. A method according to claim 1, wherein:
   (i) step c further comprises exposing the detector to a dose D3 of radiation utilizing a third spatial filter having a third bright feature, and
   (ii) geometric images in the image plane defined by the first, second and third bright features respectively of the first, second and third spatial filters do not overlap.

8. A method according to claim 7, wherein a distance between the geometric images in the image plane of the bright features of the second and third spatial filters is smaller compared to distances of flare variations in the imaging system.

9. A method according to claim 7, wherein D2 is greater than D3 and is less than D0, and D1 is greater than D0.

10. A method according to claim 9, wherein step e comprises determining whether cumulative doses received at said geometric image of the second bright feature exceeded D0 and, if so, whether cumulative doses received at said geometric image of the third bright feature exceeded D0.

11. A method according to claim 7, wherein said geometric images defined by the bright features of the second and third spatial filters are elongated and each has a length dimension that is equal to or greater than a flare influence range in the imaging system and a width dimension that is perpendicular to the length dimension and is smaller than a flare variation distance in the imaging system.

12. A method according to claim 11, further comprising, in step c, exposing a plurality of elongated spatial filters with different doses below D0.

13. The method according to claim 12, wherein the filters in the plurality are positioned in close proximity to each other along a y-axis such that the distance of flare variation along the y-axis is greater than the distance between any two filters of the plurality.

14. A method according to claim 11, wherein said geometric image defined by the bright feature of the third spatial filter has an x dimension and a y dimension that are respectively parallel to an x dimension and y dimension of geometric images defined by the bright features of the second spatial filter.

15. A method according to claim 14, wherein x dimensions of geometric images of the bright features of the second and third spatial filters cover the entire influence range of flares in the imaging system.

16. A method according to claim 1, wherein D1 is such that cumulative doses of radiation at the resist detector at a first region of the geometric image defined by the second bright feature are less than D0 and cumulative doses of radiation at the resist detector at a second region of the geometric image defined by the second bright feature are at least D0, and step e comprises determining a location within said geometric image of the bright feature of the second spatial filter of a boundary between the first and second regions.

17. A method according to claim 1, wherein step c comprises exposing the detector to the dose D1 utilizing the first spatial filter and subsequently exposing the detector to the dose D2 utilizing the second spatial filter.

18. A method according to claim 1, wherein step c comprises exposing the detector to the dose D2 utilizing the second spatial filter and subsequently exposing the detector to the dose D1 utilizing the first spatial filter.

19. A method according to claim 1, wherein the first spatial filter is implemented by an element that has a radiation transmitting or reflecting feature and is at a first position in an object plane of the imaging system and the second spatial filter is implemented by said element at a second position in the object plane.

20. A method according to claim 1, wherein the imaging system includes a source of actinic radiation and the first spatial filter is implemented by an element having a first region that is opaque to the actinic radiation and a second region that is transparent to the actinic radiation.

21. A method according to claim 1, wherein the imaging system includes a source of actinic radiation and the first spatial filter is implemented by an element having a first region that is absorbent to the actinic radiation and a second region that is reflective to the actinic radiation.

22. A method of measuring flare of an imaging system having an image plane, said method comprising:
   a. providing a resist detector that includes a resist with critical dose D0,
   b. positioning the detector at the image plane of the imaging system,
   c. exposing the detector to a dose D1 of radiation utilizing a first spatial filter having a bright feature, exposing the detector to a dose D2 of radiation utilizing a second spatial filter having a bright feature, and exposing the detector to a dose D3 of radiation utilizing a third spatial filter having a bright feature, wherein the geometric images in the image plane of the bright features of the first and second spatial filters do not overlap the geometric image in the image plane of the bright feature of the third spatial filter, D2 and D3 are less than D0, and D1 is greater than D0, and
   d. determining whether said geometric image of the bright feature of the first or second spatial filter has received a dose that exceeds D0.

23. A method according to claim 22, wherein in step a, the resist is a positive resist and D0 is the dose-to-clear.

24. A method according to claim 22, wherein in step a, the resist is a negative resist and D0 is the dose-to-cover.

25. A method according to claim 22, wherein D3 is less than D2 and step d comprises developing the resist detector, determining whether the dose received at said geometric image of the bright feature of the second spatial filter was at least D0 and, if so, whether the dose received at said geometric image of the bright feature of the third spatial filter was at least D0.

26. A method according to claim 22, wherein the distance between the geometric images in the image plane of the bright features of the second and third spatial filters is smaller compared to distance of flare variations in the imaging system.

27. A method according to claim 22, wherein said geometric images of the bright features of the first, second and third spatial filters do not overlap.

28. A method of measuring flare of an imaging system having an image plane, said method comprising:
   a. providing a resist detector that includes a resist with critical dose D0,
   b. positioning the detector at the image plane of the imaging system,
   c. exposing the detector to a dose D1 of radiation utilizing a first spatial filter having a bright feature and exposing the detector to a dose D2 of radiation utilizing a second spatial filter having a bright feature, wherein the geometric images in the image plane of the bright features of the first and second spatial filters do not overlap, D2 is less than D0, and D1 is such that said geometric image of the bright feature of the second spatial filter has a first region for which the total dose is less than D0 and a second region for which the total dose is at least D0, and
   d. determining a characteristic of a boundary between the first and second regions.

29. A method according to claim 28, wherein in step a, the resist is a positive resist and D0 is the dose-to-clear.

30. A method according to claim 28, wherein in step a, the resist is a negative resist and D0 is the dose-to-cover.

31. A method according to claim 28, wherein step d comprises developing the resist detector and measuring locations of points on the boundary between the first and second regions.

32. A method according to claim 28, wherein step c comprises exposing the detector to the dose D1 of radiation utilizing the first spatial filter and subsequently exposing the detector to the dose D2 of radiation utilizing the second spatial filter.

33. A method according to claim 28, wherein step c comprises exposing the detector to the dose D2 of radiation utilizing the second spatial filter and subsequently exposing the detector to the dose D1 of radiation utilizing the first spatial filter.

34. A method according to claim 28, wherein D1 is greater than D0.

35. A method according to claim 28, wherein said geometric image of the bright feature of the first spatial filter is congruent with said geometric image of the bright feature of the second spatial filter.

36. A method according to claim 28, wherein the first spatial filter is implemented by an element that has a radiation transmitting or reflecting feature and is at a first position in an object plane of the imaging system and the second spatial filter is implemented by said element at a second position in the object plane.

37. A method according to claim 28, wherein the imaging system includes a source of actinic radiation and the first spatial filter is implemented by an element having a first region that is opaque to the actinic radiation and a second region that is transparent to the actinic radiation.

38. A method according to claim 28, wherein the imaging system includes a source of actinic radiation and the first spatial filter is implemented by an element having a first region that is absorbent to the actinic radiation and a second region that is reflective to the actinic radiation.

39. A method of measuring flare of an imaging system, said method comprising:
   a. providing resist at an image plane of the imaging system,
   b. employing the imaging system to directly expose a first part of the resist to a first dose of radiation and to indirectly expose a second part of the resist as a result of flare,
   c. employing the imaging system to expose the second part of the resist to a second dose of radiation, and
   d. determining the flare of the imaging system from a pattern that is formed in the second part of the resist.

40. A method according to claim 39, wherein the resist is a photoresist with critical dose D0, the radiation to which the photoresist is exposed in steps b and c is optical radiation, and step d includes developing the photoresist and identifying a boundary between a region of said second part that has received a dose that is at least D0 and another region of said second part that has received a dose that is less than D0.

41. A method according to claim 40, wherein the resist is a positive resist and D0 is the dose-to-clear.

42. A method according to claim 40, wherein the resist is a negative resist and D0 is the dose-to-cover.

43. A method according to claim 39, wherein step b comprises exposing the resist to a dose D1 of radiation utilizing a first spatial filter having a bright feature, step c comprises exposing the detector to a dose D2 of radiation utilizing a second spatial filter having a bright feature, and the second part of the resist does not overlap the first part of the resist.

44. A method according to claim 43, wherein D2 is less than D0, and D1 is such that said second part of the resist has a first region for which the total dose is at least D0 and a second region for which the total dose is less than D0.

* * * * *